(12) United States Patent
Ramaswamy et al.

(10) Patent No.: US 9,431,606 B1
(45) Date of Patent: Aug. 30, 2016

(54) MEMORY CELLS

(71) Applicant: Micron Technology, Inc., Boise, ID (US)

(72) Inventors: Durai Vishak Nirmal Ramaswamy, Boise, ID (US); Dale W. Collins, Boise, ID (US); Christopher W. Petz, Boise, ID (US); Beth R. Cook, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/825,087

(22) Filed: Aug. 12, 2015

(51) Int. Cl.
*H01L 45/00* (2006.01)

(52) U.S. Cl.
CPC ......... *H01L 45/1266* (2013.01); *H01L 45/085* (2013.01); *H01L 45/1233* (2013.01); *H01L 45/1246* (2013.01)

(58) Field of Classification Search
CPC .................................................... H01L 45/085
See application file for complete search history.

(56) References Cited

U.S. PATENT DOCUMENTS

| | | | |
|---|---|---|---|
| 2009/0039336 A1* | 2/2009 | Terao | G11C 11/5614 257/4 |
| 2011/0194329 A1* | 8/2011 | Ohba | G11C 13/0011 365/148 |
| 2013/0182487 A1* | 7/2013 | Lee | G11C 13/0011 365/148 |
| 2014/0191182 A1* | 7/2014 | Yasuda | H01L 45/1253 257/4 |

* cited by examiner

*Primary Examiner* — Samuel Gebremariam
*Assistant Examiner* — Jonas T Beardsley
(74) *Attorney, Agent, or Firm* — Wells St. John P.S.

(57) ABSTRACT

Some embodiments include a memory cell having a pair of electrodes, and a plurality of switching levels between the electrodes. Each switching level has an ion buffer region and a dielectric region. At least one switching level differs from another switching level in one or both of thickness and composition of the ion buffer region and/or the dielectric region.

6 Claims, 3 Drawing Sheets

MEMORY CELLS

TECHNICAL FIELD

Memory cells which contain stacked ion buffer regions and dielectric regions.

BACKGROUND

Integrated memory may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory cell is a programmable metallization cell (PMC). Such may be alternatively referred to as conductive bridging random access memory (CBRAM), nano-bridge memory, or electrolyte memory. A PMC may use ion conductive switching material (for instance, a suitable chalcogenide or any of various suitable oxides) and an ion source material adjacent the switching material. The ion source material and switching material may be provided between a pair of electrodes. A suitable voltage applied across the electrodes can cause ions to migrate from the ion source material into the switching material to thereby create one or more current-conductive paths through the switching material. An opposite voltage applied across the electrodes essentially reverses the process and thus removes the current-conductive paths. A PMC thus comprises a high resistance state (corresponding to the state lacking a conductive bridge extending through a switching material) and a low resistance state (corresponding to the state having a conductive bridge extending through the switching material), with such states being reversibly interchangeable with one another.

Referring to FIG. 1, a prior art memory cell 200 is illustrated in two modes corresponding to a high resistance state (HRS) and a low resistance state (LRS). The two modes are reversibly interchanged with one another through application of electric fields EF(+) and EF(−), with EF(+) being of opposite polarity relative to EF(−).

The memory cell comprises a pair of electrodes 212 and 214. The memory cell also comprises a dielectric region 216 over the electrode 214, an ion buffer region 218 over the dielectric region, and an ion source region 220 between the ion buffer region and the electrode 212.

The memory cell 200 is shown to have the electrode 212 connected to external circuitry 230, and to have the electrode 214 connected to external circuitry 232. Circuitries 230 and 232 may include sense and/or access lines coupled to the electrodes, and configured for providing appropriate electric fields across the memory cell during read/write operations.

A conductive bridge 226 forms across regions 216 and 218 in transitioning from the HRS mode to the LRS mode. Although only one conductive bridge is shown, there may be multiple conductive bridges present in the LRS mode. Also, although the conductive bridge 226 is shown to span an entire distance from a top surface of electrode 214 to a bottom surface of ion source region 220, the conductive bridge may alternatively only extend partially across such distance. For instance, a conductive bridge may be discontinuous, and may be broken by one or more small gaps. In operation, charge carriers may "jump" such gaps to complete a circuit. Although the conductive bridge 226 is shown to be entirely absent in the HRS mode of the cell, in some applications a portion of the conductive bridge may be present in the HRS mode.

The ion source region 220 contributes ions which ultimately form the conductive bridge 226.

A difficulty which may be encountered in utilizing memory cells of the type described in FIG. 1 is that there may be excess ions available in transitioning to the LRS mode so that the ion concentration excessively builds up during formation of filament 226 (such may be referred to as an "overset" problem). The excess ions may eventually lead to cycling failure of the memory cells.

It is desired to develop improved memory cells.

DETAILED DESCRIPTION OF THE ILLUSTRATED EMBODIMENTS

Figure 1:
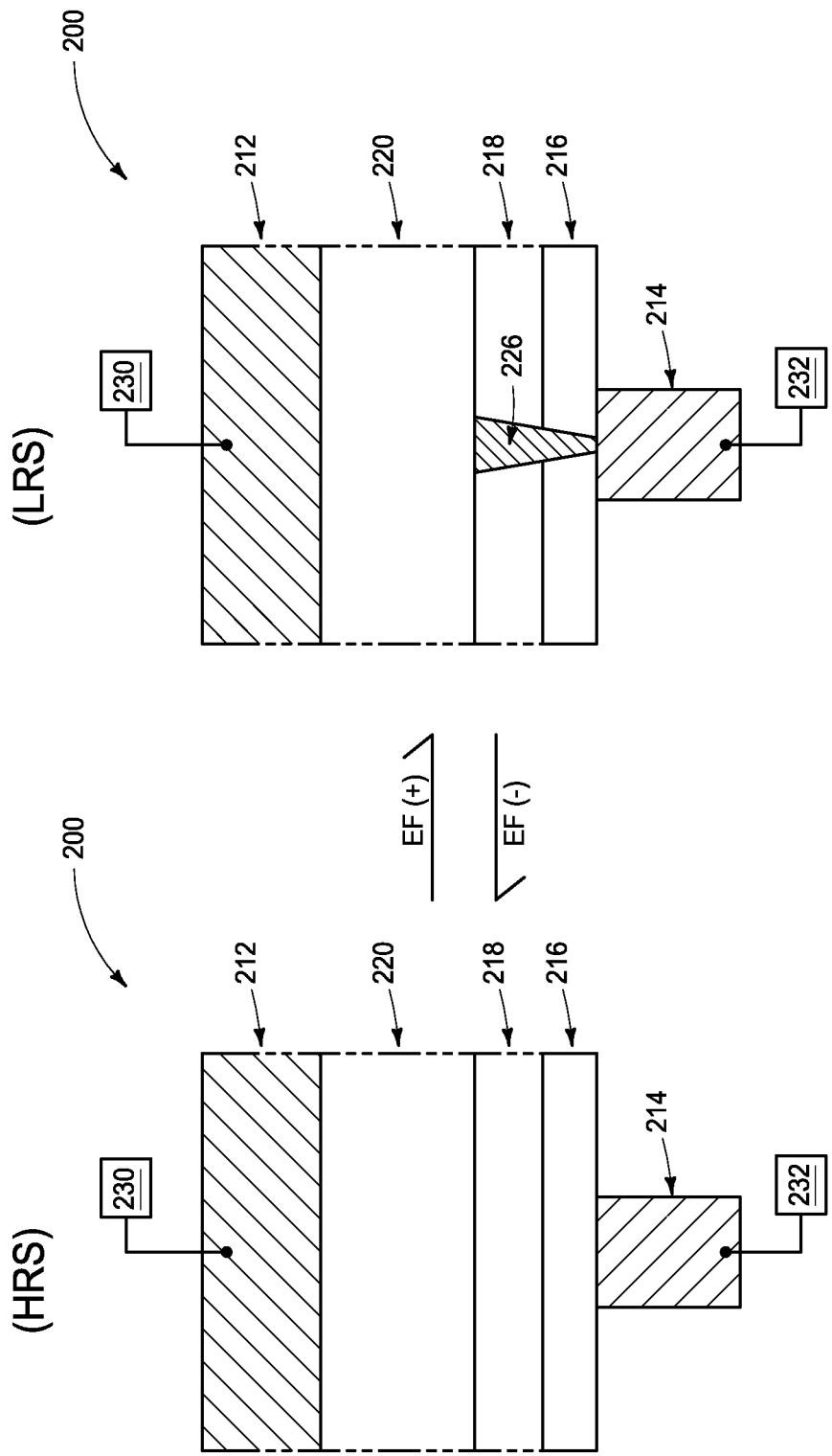
FIG. 1 diagrammatically illustrates a prior art memory cell reversibly transitioning between a low resistance state and a high resistance state. The memory cell is shown in cross-sectional side view.

Some embodiments include improved memory cell designs which enable the memory cells to be tailored for specific applications. The improved memory cell designs may also enable the overset problem discussed above with reference to FIG. 1 to be alleviated, or even prevented. Example memory cells are described with reference to FIGS. 2 and 3.

Figure 2:
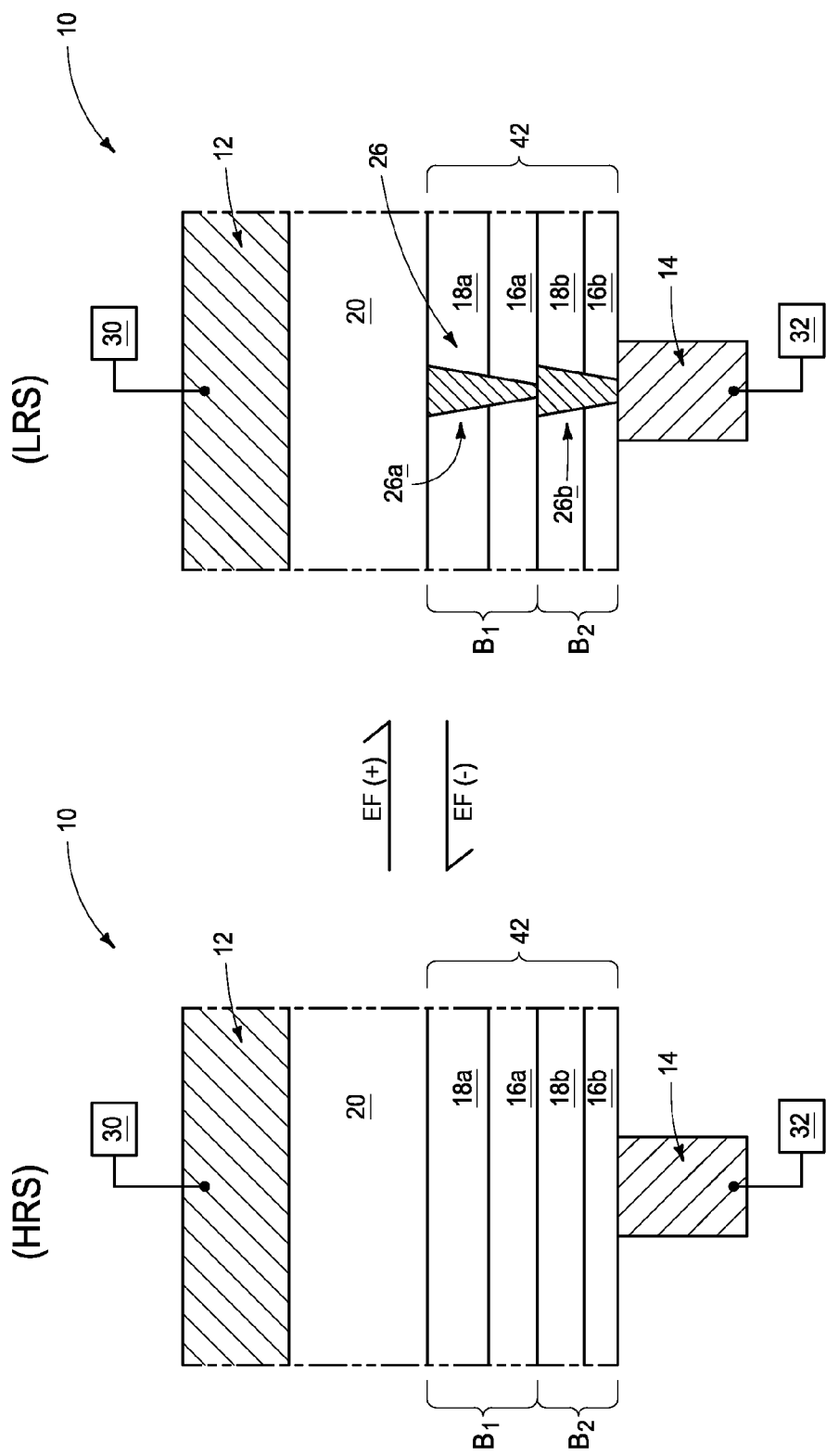
FIG. 2 diagrammatically illustrates an example embodiment memory cell reversibly transitioning between a low resistance state and a high resistance state. The memory cell is shown in cross-sectional side view.

Referring to FIG. 2, an example embodiment memory cell 10 is illustrated in two modes corresponding to a high resistance state (HRS) and a low resistance state (LRS). The two modes are reversibly interchanged with one another through application of electric fields EF(+) and EF(−), with EF(+) being of opposite polarity relative to EF(−).

The memory cell 10 comprises a pair of electrodes 12 and 14. The electrodes 12 and 14 may comprise any suitable electrically conductive composition or combination of compositions; and may be the same composition as one another or may be different compositions relative to one another. In some embodiments, the electrodes may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, in some embodiments the electrode 14 may comprise, consist essentially of, or consist of titanium nitride; and the electrode 12 may comprise, consist essentially of, or consist of tungsten.

The memory cell 10 is shown to have the electrode 12 connected to external circuitry 30, and to have the electrode 14 connected to external circuitry 32. Circuitries 30 and 32 may include sense and/or access lines coupled to the electrodes, and configured for providing appropriate electric fields across the memory cell during read/write operations. In some embodiments, the illustrated memory cell may be one of a plurality of memory cells of a memory array, and the circuitries 30 and 32 may be part of a circuit configuration utilized to uniquely address each of the memory cells of the array. In some embodiments, a "select device" (not shown) may be provided adjacent the memory cell 10 to reduce undesired current leakage to and/or from the memory cell during utilization of the memory cell in a memory array. Example select devices include diodes, transistors, ovonic threshold switches, etc.

In some embodiments, the electrodes 12 and 14 may be referred to as a first electrode and a second electrode, respectively.

The memory cell 10 comprises an ion source region 20 adjacent the electrode 12. The ion source region 20 contributes ions which ultimately form a conductive bridge 26. The ion source region may comprise any suitable composition or combination of compositions. In some embodiments, the ion source region may comprise one or more of aluminum, copper, silver and tellurium; and may be configured for contributing aluminum cations, copper cations and/or silver cations for formation of the conductive bridge. In some embodiments, the ion source region may comprise one or more of Te, N, Cu, Ag and Al.

The memory cell 10 further comprises a pair of switching levels $B_1$ and $B_2$, with each of the levels comprising an ion buffer region 18 (a or b) paired with a dielectric region 16 (a or b). The switching levels $B_1$ and $B_2$ may referred to as "bi-regions" or "bilayers" because each comprises two separate regions (or layers); with level $B_1$ comprising the regions 16a and 18a, and with level $B_2$ comprising the regions 16b and 18b.

The levels $B_1$ and $B_2$ form a stack 42. In some embodiments, the dielectric regions 16a and 16b within the stack may be referred to as first and second dielectric regions, respectively; and similarly the ion buffer regions 18a and 18b within the stack may be referred to as first and second ion buffer regions, respectively.

The dielectric regions 16a and 16b may be alternatively referred to as tunnel regions, and the ion buffer regions 18a and 18b may be alternatively referred to as electrolyte regions.

The dielectric regions 16a and 16b may comprise any suitable compositions or combinations of compositions, and in some embodiments may comprise one or more of $SiO_x$, $ZrO_x$, $TiO_x$, $TaO_x$, $HfO_x$, $AlO_x$, $WO_x$, $SnO_x$, $NbO_x$, $HfSi_yO_x$, $ZrTi_yO_x$, $Zr_xWO_y$, $AlTi_xO_y$, $VO_x$, $MoO_y$, $NiO_y$, $YO_x$, $ReO_x$, $MnO_x$, $FeO_x$, $SiAlO_x$ and $SiTiO_x$; where x and y are numbers greater than 0. For instance, in some embodiments one or both of the dielectric regions may comprise $AlO_x$. The dielectric regions 16a and 16b may have any suitable thicknesses; and in some embodiments may have thicknesses within a range of from about 5 Å to about 30 Å. In some embodiments the dielectric regions 16a and 16b may be considered to comprise one or more of SiO, ZrO, TiO, TaO, HfO, AlO, WO, SnO, NbO, HfSiO, ZrTiO, ZrWO, AlTiO, VO, MoO, NiO, YO, ReO, MnO, FeO, SiAlO and SiTiO; where the chemical formulas list primary constituents rather than designating specific stoichiometries.

The ion buffer regions 18a and 18b may comprise any suitable compositions or combinations of compositions, and in some embodiments may comprise one or more of Cu, Zr, Al, Te, O, Ge, Se, Sb, C, Si, and S. For instance, in some embodiments one or both of the ion buffer regions may comprise CuZrAlTeO, where the chemical formula lists primary constituents rather than designating a specific stoichiometry. The ion buffer regions 18a and 18b may have any suitable thicknesses; and in some embodiments may have thicknesses within a range of from about 10 Å to about 100 Å.

The levels $B_1$ and $B_2$ differ from one another in one or both of the thickness and composition of either an ion buffer region (i.e., differ in thickness and/or composition of region 18a relative to 18b) or a dielectric region (i.e., differ in thickness and/or composition of region 16a relative to 16b).

In a specific configuration, the dielectric regions 16a and 16b both comprise aluminum oxide, with the dielectric region 16b being thinner than the dielectric region 16a. For instance, the dielectric region 16b may have a thickness within a range of from about 5 Å to about 10 Å, and the dielectric region 16a may have a thickness of at least about 20 Å. Accordingly, in some embodiments the dielectric region 16a may be at least about twice as thick as the dielectric region 16b. Additionally, the ion buffer regions 18a and 18b may both comprise compositions containing copper, zirconium, aluminum, tellurium and oxygen; but the concentration of tellurium may be higher in the second ion buffer region 18b than in the first ion buffer region 18a while the concentration of aluminum is lower in the second ion buffer region 18b than in the first ion buffer region 18a. Further, the second ion buffer region 18b may be thinner than the first ion buffer region 18a. For instance, the second ion buffer region 18b may have a thickness within a range of from about 25 Å to about 35 Å while the first ion buffer region 18a has a thickness within a range of from about 40 Å to about 50 Å. An advantage of this specific configuration may be that the relatively thick regions 16a and 18a of upper switching region $B_1$ may filter excess conductive ions so that the lower switching region $B_2$ is protected from exposure to excessive conductive ions during operation of the memory cell. Such may prevent the overset problem discussed above. Such may also enable regions 16b and 18b to be kept thin, which may improve switchability of the memory cell; and yet the combination of two switching regions $B_1$ and $B_2$ may enable suitable data retention.

In the illustrated embodiment, a conductive bridge 26 forms across switching regions $B_1$ and $B_2$ in transitioning from the HRS mode to the LRS mode. The shown conductive bridge has a first portion 26a within switching region $B_1$ and a second portion 26b within switching region $B_2$. Such is a diagrammatic representation of one possible configuration of the conductive bridge, and other configurations may occur. Also, although only one conductive bridge is shown, in some embodiments there may be multiple conductive bridges present in the LRS mode. Also, although the conductive bridge 26 is shown to span an entire distance from a top surface of electrode 14 to a bottom surface of ion source region 20, the conductive bridge may alternatively only extend partially across such distance. For instance, a conductive bridge may be discontinuous, and may be broken by one or more small gaps. In operation, charge carriers may "jump" such gaps to complete a circuit. Although the conductive bridge 26 is shown to be entirely absent in the HRS mode of the cell, in some applications a portion of the conductive bridge may be present in the HRS mode.

A goal during design and fabrication of memory cells is to balance endurance characteristics and retention characteristics of the memory cells. Specifically, memory cells may be designed to have high stability in the respective LRS and HRS modes, and such memory cells will have good retention characteristics (i.e., will stably retain memory bits). However, switchability between the LRS and HRS modes may become increasingly difficult as the stability of the respective LRS and HRS modes increases, and accordingly higher electrical fields may be required for switching memory cells with increasing stability of the respective LRS and HRS modes. Exposure of memory cells to relatively high electrical fields may degrade the memory cells faster than exposure to relatively low electrical fields, which decreases endurance characteristics of the memory cells. Embodiments described herein may enable memory cells to be tailored to achieve a desired balance of endurance characteristics relative to retention characteristics for particular applications. Embodiments described herein may also enable other characteristics of memory cells to be tailored for specific applications.

Figure 3:
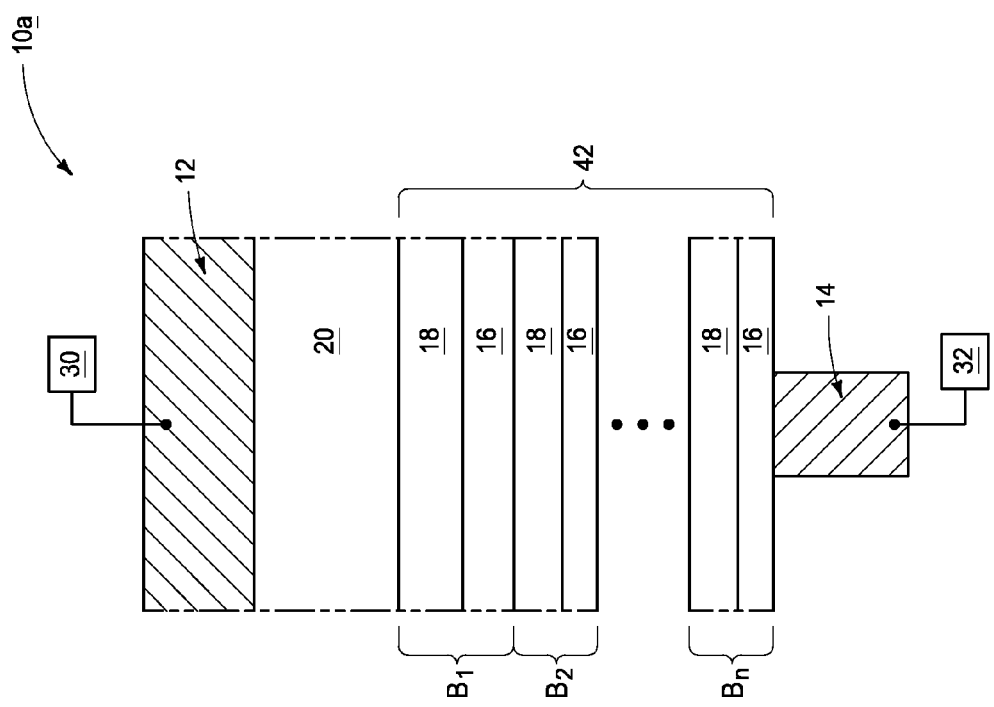
FIG. 3 diagrammatically illustrates another example embodiment memory cell. The memory cell is shown in cross-sectional side view.

FIG. 3 shows an example embodiment memory cell 10a similar to the memory cell 10 of FIG. 2, but comprising additional switching levels besides the levels $B_1$ and $B_2$. Any suitable number of switching levels may be utilized to tailor the memory cell for a specific application. At least one of the switching levels may have a dielectric region 16 which differs relative to a dielectric region 16 of another level in one or both of composition or thickness; and/or at least one of the switching levels may have an ion buffer region 18 which differs relative to an ion buffer region 18 of another level in one or both of composition or thickness.

Although the memory cells are described as being two-state devices (for instance, the two memory states of the device of FIG. 2 correspond to the illustrated LRS mode and the HRS mode), in some embodiments the utilization of multiple switching levels may enable fabrication of memory cells suitable for utilization as multi-state devices (i.e., suitable for having more than two memory states due to the devices having more than two selectable and interchangeable modes).

The memory cells described above may be supported by an underlying substrate (not shown). The substrate may comprise semiconductor material (for example, may comprise, consist essentially of, or consist of monocrystalline silicon), and may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The memory cells described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell comprising a pair of electrodes, and a plurality of switching levels between the electrodes. Each switching level comprises an ion buffer region and a dielectric region. At least one switching level differs from another switching level in one or both of thickness and composition of the ion buffer region and/or the dielectric region.

Some embodiments include a memory cell comprising a second electrode spaced from a first electrode, an ion source region proximate the first electrode, and a stack of alternating ion buffer regions and dielectric regions between the ion source region and the second electrode. The stack comprises switching levels corresponding to ion buffer regions paired with adjacent dielectric regions. At least one ion buffer region differs from at least one other ion buffer region in one or both of composition and thickness.

Some embodiments include a memory cell comprising a second electrode spaced from a first electrode, an ion source region proximate the first electrode, and a stack of alternating ion buffer regions and dielectric regions between the ion source region and the second electrode. The stack comprises switching levels corresponding to ion buffer regions paired with adjacent dielectric regions. At least one dielectric region differs from at least one other dielectric region in one or both of composition and thickness.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
a pair of electrodes, the electrodes being a first electrode and a second electrode, the first electrode being over the second electrode;
first and second switching regions between the electrodes; the first switching region being over the second switching region; the first switching region comprising a first ion buffer layer and a first dielectric layer; the second switching region comprising a second ion buffer layer and a second dielectric layer; wherein the first and second ion buffer layers comprise CuZrAlTeO, where the chemical formula lists primary constituents rather than designating a specific stoichiometry;

an ion source region between the first switching region and the first electrode; the second switching region being spaced from the ion source region by the first switching region;

wherein the first dielectric layer is thicker than the second dielectric layer;

wherein the first and second ion buffer layers comprise first and second concentrations of tellurium, respectively; and wherein the second concentration of tellurium is higher than the first concentration of tellurium; and wherein the first and second ion buffer layers comprise first and second concentrations of aluminum, respectively; and wherein the second concentration of aluminum is lower than the first concentration of aluminum.

2. The memory cell of claim 1 wherein the first ion buffer layer is thicker than the second ion buffer layer.

3. A memory cell, comprising:
a second electrode spaced from a first electrode;
an ion source region proximate the first electrode;
a stack of alternating ion buffer layers and dielectric layers between the ion source region and the second electrode; the stack comprising switching regions with each switching region corresponding to one of the ion buffer regions layers paired with an adjacent one of the dielectric layers; wherein a first of the ion buffer layers is closer to the ion source region than a second of the ion buffer layers; wherein the first ion buffer layer is thicker than the second ion buffer layer; wherein the first and second ion buffer layers comprise CuZrAlTeO, where the chemical formula lists primary constituents rather than designating a specific stoichiometry; wherein the first ion buffer layer has a first tellurium concentration and a first aluminum concentration; wherein the second ion buffer layer has a second aluminum concentration and a second tellurium concentration; and
wherein the second tellurium concentration is higher than the first tellurium concentration, and the second aluminum concentration is lower than the first aluminum concentration.

4. The memory cell of claim 3 comprising at least three of the switching regions between the first and second electrodes.

5. A memory cell, comprising:
a second electrode spaced from a first electrode;
an ion source region proximate the first electrode;
a stack of alternating ion buffer layers and dielectric layers between the ion source region and the second electrode; the stack comprising switching regions corresponding to ion buffer layers paired with adjacent dielectric layers; wherein a first of the dielectric layers is closer to the ion source region than a second of the dielectric layers; wherein the first and second dielectric layers comprise AlO, where the chemical formula lists primary constituents rather than designating a specific stoichiometry; and
wherein:
a first of the switching regions comprises a first of the ion buffer layers paired with the first dielectric layer, and a second of the switching regions comprises a second of the ion buffer layers paired with the second dielectric layer, the first ion buffer layer being between the second ion buffer layer and the ion source region;
the first ion buffer layer is thicker than the second ion buffer layer;
the first and second ion buffer layers comprise CuZrAlTeO, where the chemical formula lists primary constituents rather than designating a specific stoichiometry;
the first ion buffer layer has a first tellurium concentration and a first aluminum concentration;
the second ion buffer layer has a second tellurium concentration and a second aluminum concentration; and
the second tellurium concentration is higher than the first tellurium concentration, and the second aluminum concentration is lower than the first aluminum concentration.

6. The memory cell of claim 5 comprising at least three of the switching regions between the first and second electrodes.

* * * * *